(12) United States Patent
Smith et al.

(10) Patent No.: US 7,983,332 B2
(45) Date of Patent: Jul. 19, 2011

(54) EYE VIOLATION AND EXCESS JITTER TRIGGER

(75) Inventors: Patrick A. Smith, Beaverton, OR (US); Daniel G. Knierim, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 726 days.

(21) Appl. No.: 11/938,384

(22) Filed: Nov. 12, 2007

(65) Prior Publication Data

US 2009/0122852 A1    May 14, 2009

(51) Int. Cl.
*H04B 3/46* (2006.01)
(52) U.S. Cl. .................................................. 375/226
(58) Field of Classification Search .............. 375/224, 375/226
See application file for complete search history.

(56) References Cited

U.S. PATENT DOCUMENTS

| | | | |
|---|---|---|---|
| 4,218,771 A * | 8/1980 | Hogge, Jr. ................. | 375/376 |
| 5,491,722 A * | 2/1996 | Jones et al. ................. | 375/224 |
| 6,577,964 B1 | 6/2003 | LeCheminant et al. | |
| 2007/0253474 A1 | 11/2007 | Smith | |

FOREIGN PATENT DOCUMENTS

| | | |
|---|---|---|
| EP | 1460793 | 9/2004 |
| EP | 1460793 A1 * | 9/2004 |

OTHER PUBLICATIONS

XYZ's of Oscilloscopes.

* cited by examiner

*Primary Examiner* — David C. Payne
*Assistant Examiner* — Leon-Viet Q Nguyen
(74) *Attorney, Agent, or Firm* — Francis I. Gray; Thomas F. Lenihan

(57) ABSTRACT

An eye violation and excess jitter trigger for a digital signal uses a mask within a unit interval of the digital signal, such as a rectangular mask having corners defined by a high threshold, a low threshold, an early clock and a late clock, the early and late clocks being derived from a reference clock. The reference clock may be a recovered clock derived from the digital signal or from high and low threshold comparator outputs, or may be an external clock. For the excess jitter trigger, which is a special case of the eye violation trigger, the high and low thresholds are essentially equal. A status of the digital signal with respect to the mask is determined using the high and low thresholds and the early and late clocks, and a violation signal is output when the status indicates that a portion of the digital signal crossed into the mask. The violation signal may then be used to trigger data acquisition or for other purposes.

17 Claims, 4 Drawing Sheets

US 7,983,332 B2

EYE VIOLATION AND EXCESS JITTER TRIGGER

FIELD OF THE INVENTION

The present invention relates to the field of acquisition of data from an electronic signal, and more particularly to triggers for initiating such data acquisition.

BACKGROUND OF THE INVENTION

As parallel data buses have started to become less popular, they are being replaced by high speed serial communication buses. The electronics industry has used eye diagrams for several years as a way to specify the quality of a serial digital signal. The serial digital signal is an analog signal that transitions between two voltage levels representing, respectively, a logic "1" and a logic "0", the transitions occurring at regular clock intervals. A mask or keep-out region is used to define an area which should not be traversed by the digital signals during a unit interval (UI) or symbol period, corresponding to one clock interval, in order to ensure the highest quality data recovery. Oscilloscopes are very useful tools for displaying eye diagrams and showing eye violations, as shown in prior art FIG. 1.

Unfortunately, the usefulness of an eye diagram in current oscilloscopes is limited by the fact that an eye diagram is a post-processing tool, meaning that the data record must have already been captured, in response to the detection of a unique trigger condition, before the data waveform can be applied to a mask to determine the occurrence of a mask violation.

That is, oscilloscope users who are debugging serial digital data channels must capture a record of data by employing one of numerous known triggers and use a software-based post-processing search of the acquired data record to find eye violations. This technique suffers from a relatively long "dead time" between acquisitions during which the oscilloscope is processing the most recently acquired data record. Moreover, it may be that the acquired data record that is currently being processed does not include any eye violations, resulting in a waste of processing time in which the oscilloscope is engaged in a futile search for non-existent anomalies. Unfortunately, data that does include eye violations will be overlooked if that data occurs when the oscilloscope is busy searching the current record.

What is needed is an apparatus and method that avoids such futile searches for non-existent eye violations, thereby substantially eliminating the dead time related to such futile searches.

SUMMARY OF THE INVENTION

Accordingly, the present invention provides an eye violation and excess jitter trigger that assures that data from a serial digital signal is acquired only when an eye violation occurs. An eye violation mask is defined, for example, by a high threshold, a low threshold, an early clock and a late clock which determine the corners for a rectangular eye violation mask. By examining the data at each of the four corners of the mask for a given unit interval, a determination is made as to whether an eye violation occurred, i.e., whether the data passed through the mask rather than around the mask. Any eye violation determination may then be used as a trigger signal to acquire the serial digital signal, assuring that the eye violation has been captured and, thus, minimizing processing time. By adjusting the height of the mask to be very small, excessive jitter determinations may also be made.

The objects, advantages and other novel features of the present invention are apparent from the following detailed description when read in conjunction with the appended claims and attached drawing.

DETAILED DESCRIPTION OF THE DRAWING

Figure 1:
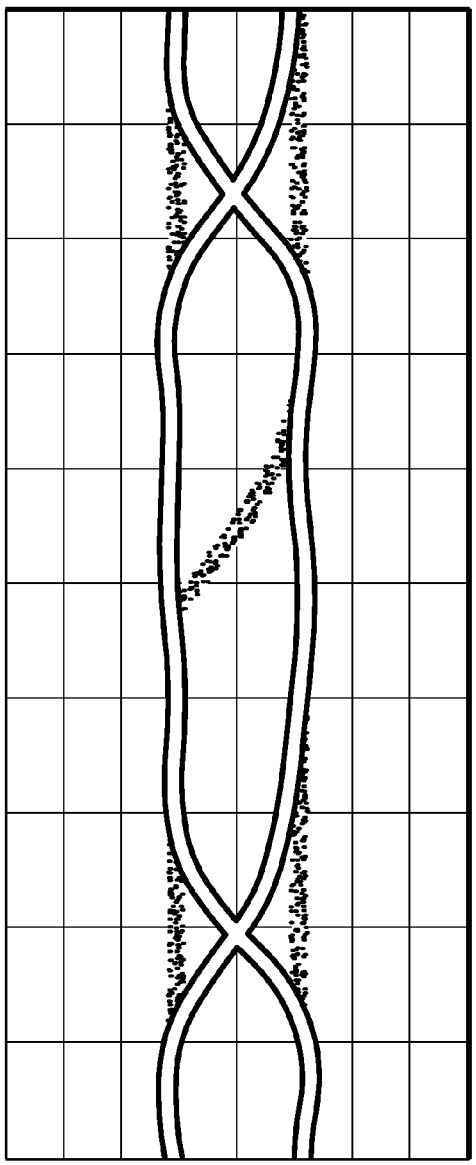
FIG. 1 is a conventional display view of a serial digital signal having an eye violation, as known from the prior art.
Figure 2:
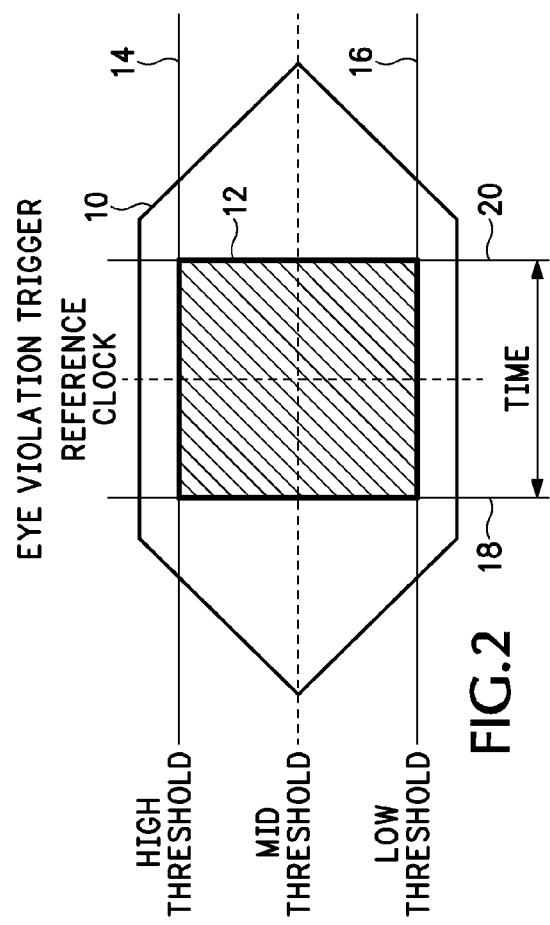
FIG. 2 is a graphic view of a mask for an eye violation trigger according to an embodiment of the present invention.

Referring now to FIG. 2, a basic eye violation trigger uses a mask, such as a rectangular mask 12, within an idealized eye region 10. The rectangular mask 12 may be defined by setting two voltage thresholds 14, 16 and two time values 18, 20. The voltage thresholds 14, 16 and time values 18, 20 establish the corners of the mask 12.

Figure 3:
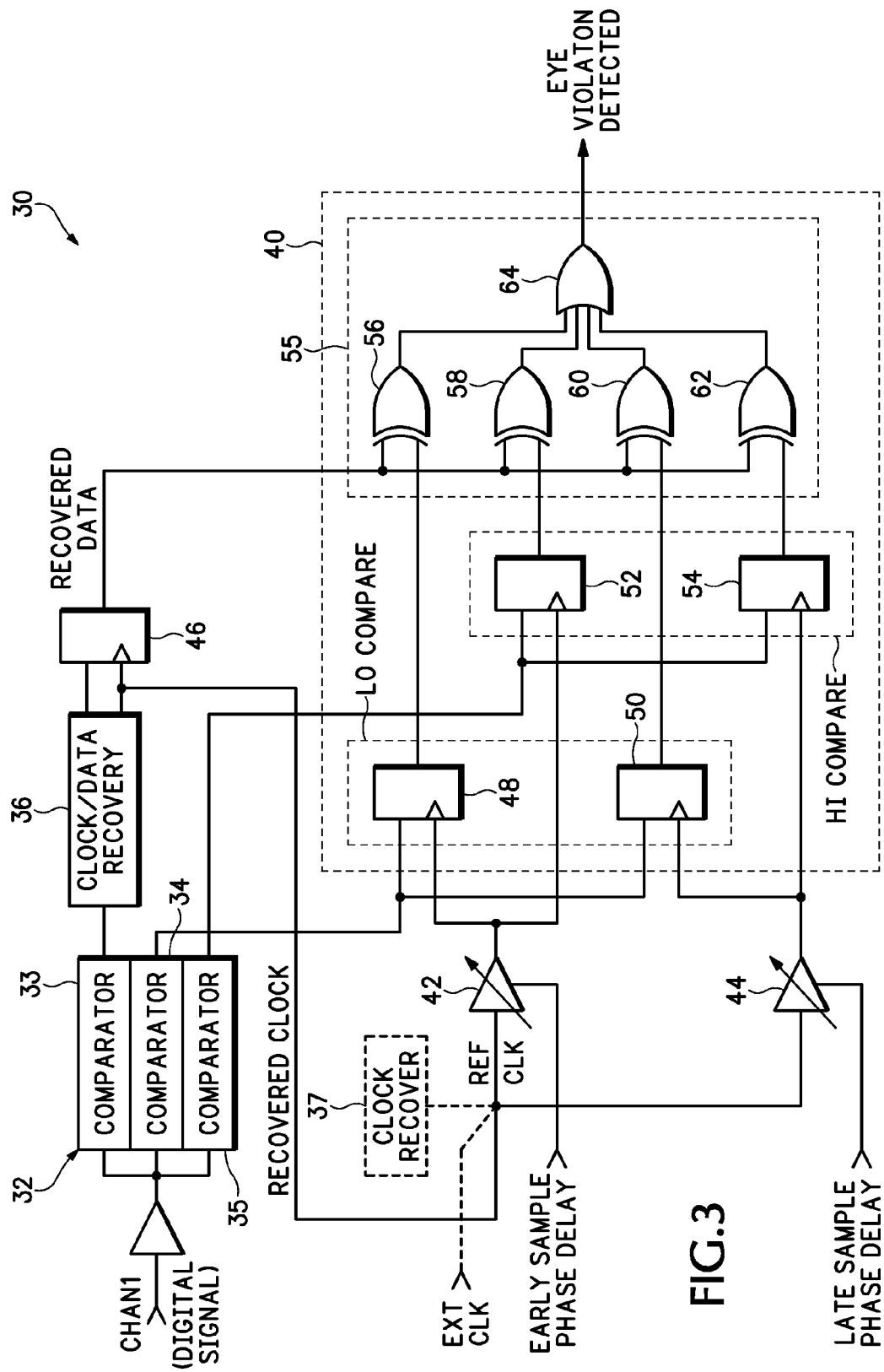
FIG. 3 is a block diagram view of an eye violation and excess jitter trigger circuit according to an embodiment of the present invention.

As shown in FIG. 3, an eye violation trigger circuit 30 has a comparator section 32, a clock-data recovery section 36 or reference clock source and an eye violation detection section 40. The comparator section 32 in this example has three comparators 33, 34, 35, each comparator being set to a different threshold level for an input signal. One comparator 33 has its threshold level set to a mid-point of the signal, and its output is input to the clock/data recovery circuit 36 to recover the clock and data. The recovered clock output by the clock/data recovery circuit 36 provides a timing reference point or reference clock. The second comparator 34 has its threshold level set to detect when the signal goes above a low limit 16 (see FIG. 2), while the third comparator 35 has its threshold level set to detect when the signal goes above a high limit 14. The reference clock may also be provided by a user from an external source, or may be derived from the high and low comparator outputs using an alternative clock recovery circuit 37.

Figure 4:
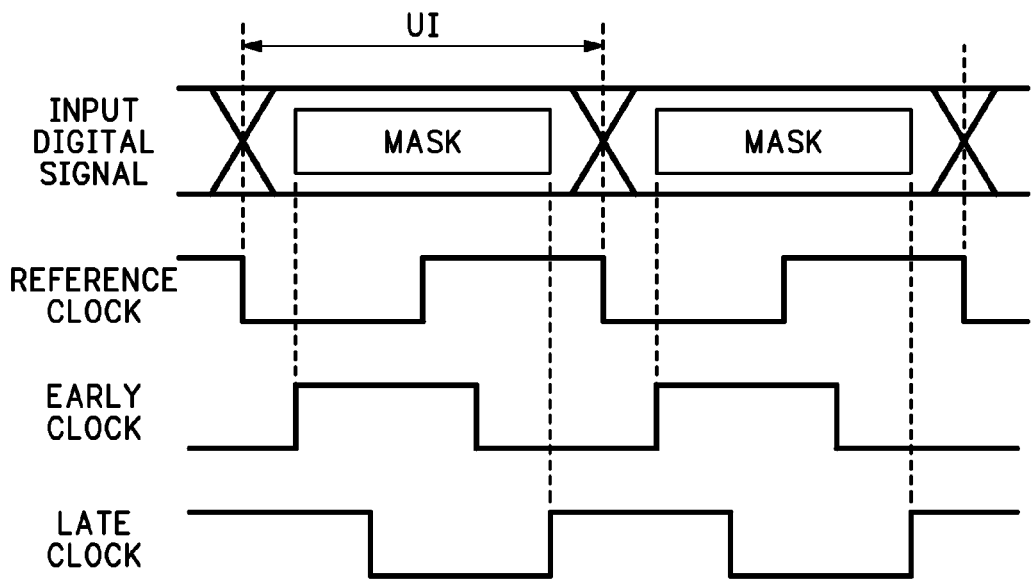
FIG. 4 is a timing diagram view for the circuit shown in FIG. 3 according to an embodiment of the present invention.

The outputs from the second and third comparators 34, 35 are input to the eye violation detection section 40. The reference clock is input to two variable clock phase/delay circuits 42, 44, the outputs of which are a pair of variable phase clock signals corresponding to the early time limit 18 and the late time limit 20 (see FIG. 2). The variable phase clock signals also are input to the eye violation detection section 40. Although the reference clock may be varied by specified time intervals to produce the early and late clocks, preferably the phase of the reference clock is varied so that the early and late clocks are consistent despite any variations in the frequency of the reference clock. The low and high comparator outputs and the early and late clocks define the rectangular mask 12 shown in FIG. 2, and as further shown in the timing diagram of FIG. 4.

The input signal passes through the clock/data recovery section 36 and is clocked by the reference clock via an input latch 46, such as an edge sensitive latch or flip-flop or a level sensitive or transparent latch, to produce recovered data that is input to the eye violation detection section 40. The latches referenced herein are shown for purposes of illustration as flip-flops. Although not necessary, the recovered data provides another reference point for detecting eye violations. The low threshold output from the low comparator 34 is input to a pair of latches 48, 50 which are clocked respectively by the early and late clocks. Likewise the high threshold output from the high comparator 35 is input to another pair of latches 52, 54 which also are clocked respectively by the early and late clocks. The outputs from the latches 48-54 represent the state of the input signal at all four corners of the mask 12 and are input to an equality gate 55. As illustrated the equality gate 55 may be in the form of exclusive OR gates 56-62 to which are input respectively the outputs from the latches 48-54 as well as the recovered data from the input latch 46. The XOR gates 56-62 compare the mask corner values with the recovered data value and provide a logic "true" output when there is a discrepancy at any of the mask corners with the center of the unit interval. The XOR gates 56-62 do not provide a logic "true" output when all of the outputs from the respective latches 46-54 are the same. An output OR gate 64 receives the outputs from the XOR gates 56-62 and provides an eye mask violation detection signal when any of the outputs from the XOR gates indicate a discrepancy. In other words the equality gate 55 provides a "no-violation" output when all of the inputs are the same, and a "violation" output when any of the inputs is different from the other inputs. The eye mask violation detection signal may be used as a trigger signal to acquire data from the input signal surrounding the detected eye mask violation.

The clock recovery circuit can use any appropriate method for the serial standard being tested. For example, any of the following would be acceptable: a PLL (phase locked loop) locked to the data edges, or a PLL locked to a reference clock followed by a Delay-Locked-Loop (DLL) locked to the data edges, or perhaps even multiple DLLs driven by a reference clock and locked to the data edges.

The above described embodiment uses trigger comparators to track the status of the user's signal, as such each comparator of FIG. 3 represents a single-bit comparator, the multiple comparators 33, when taken together, can be considered to be a multi-bit comparator. However, one skilled in the art will realize that another embodiment incorporating somewhat similar topology could be implemented with digital comparators that observe the output stream of an A/D converter that is capturing the input signal in real-time. Such an arrangement is practical for low-speed standards today and perhaps even for high-speed standards in the future if DSP throughput increases faster than I/O speeds.

Figure 5:
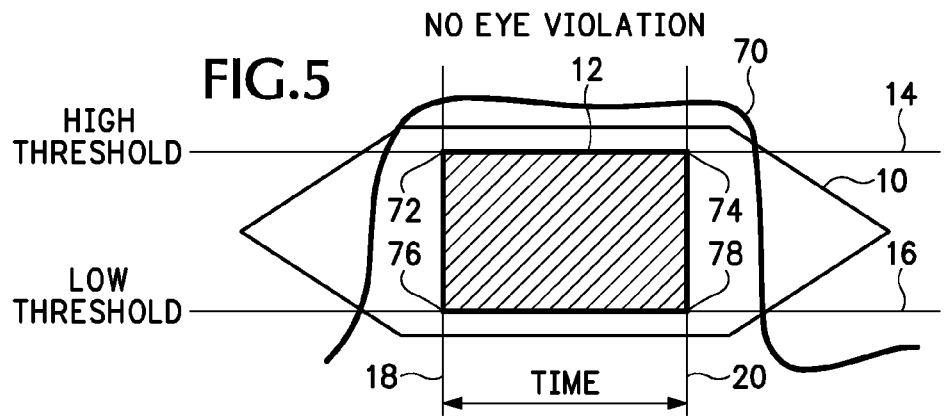
FIG. 5 is a graphic view illustrating a valid eye diagram with respect to the mask shown in FIG. 2 according to an embodiment of the present invention.

FIG. 5 shows an input signal 70 that, although not ideal, meets eye diagram criteria, i.e., no eye violations as the value of the data at the four corners 72-78 and the center of the mask 12 are all "high." Specifically at each of the corners of the mask 12 the data values (shown as a "high" value) are above the respective threshold levels 14, 16 so the outputs from the latches 46-54 (latches 48-54 define the respective corners 72-78) are all high. For the inverse where the data value is "low", the outputs from the latches 46-54 are all low. Therefore the outputs from the XOR gates 56-62 are all low and the output from the OR gate 64 stays low—no eye violation detected.

Figure 6:
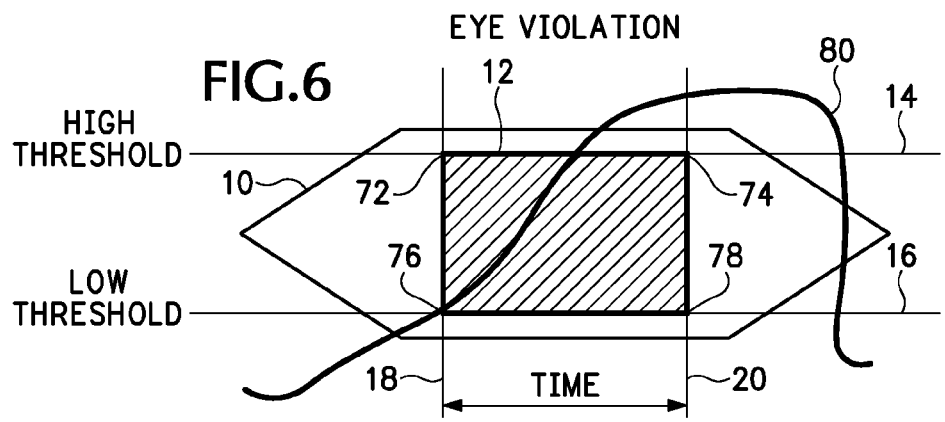
FIG. 6 is a graphic view illustrating an eye violation with respect to the mask shown in FIG. 2 according to an embodiment of the present invention.

FIG. 6 shows an input signal 80 that exhibits an eye violation, namely the signal passes through the mask 12 rather than going around it. In this example the outputs from the latches 46, 48, 50, 54 (corners 74-78) are high, but the output from the latch 52 (corner 72) is low. Therefore there is an inequality and one (58) of the XOR gates 56-62 has a high output. Therefore the output from the OR gate 64 goes high, indicating an eye violation.

The circuit shown in FIG. 3 does not detect all "glitches" or "runts", i.e., signals that cross one or both threshold levels in both directions within the mask 12, since at the mask corners 72-78 and the center of the unit interval the values may still be all low or high. However the circuit of FIG. 3 may be optimized for speed as the early and late clock timing may be arbitrarily chosen within the UI. That is, the early and late clocks can be set arbitrarily close or identical to each other. Additionally, for wide masks where a "glitch" might occur on the output during the interval between early and late clocks, and depending on details of the particular circuit implementation chosen and the allowed mask widths, the glitch can be addressed using one or more of the following ideas: for narrow masks widths, use slow logic to avoid propagating a glitch, for wider masks, add a nominal delay roughly equal to the mask width in the "early" flip-flop 48,52 output paths and a smaller delay in the "mid" flip-flop 46 output path, add latches clocked by the "late" clock 44 in series with the "early" 48,52 and "mid" flip-flop 46 output paths to hold their prior states until the "late" flip-flop 50,54 output signals are ready, and/or place an additional flip-flop in series with the equality-gate 64 output to capture its state only when all the inputs represent samples from the same Unit-interval.

Figure 7:
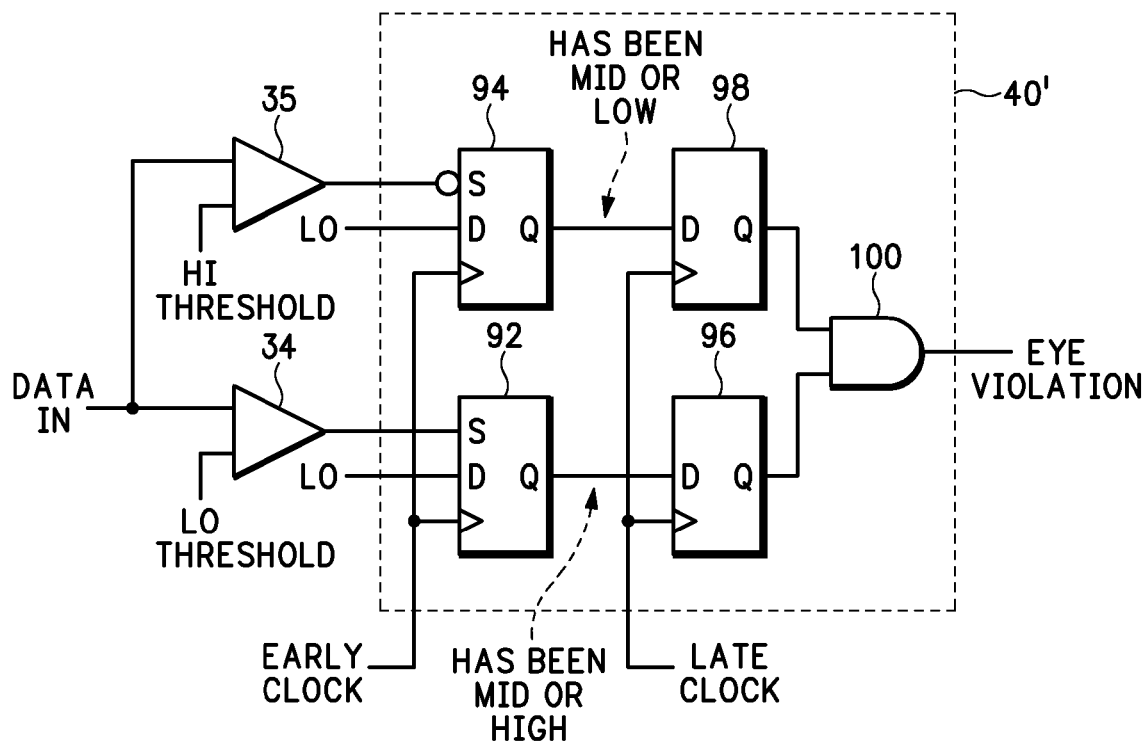
FIG. 7 is a block diagram view of an alternative embodiment of an eye violation and excess jitter trigger circuit according to an embodiment of the present invention.

An alternative circuit 40' for the eye violation detector is shown in FIG. 7 that, although tending to be slower, is more thorough as it includes detection of arbitrary glitches or runts as well. The low comparator 34 provides a set input for a low set/reset latch 92, while the output from the high comparator 35 is inverted and provides a set input for a high set/reset latch 94. The set/reset latches 92, 94 are reset to a low value by the early clock, i.e, at the beginning of the mask 12. The outputs of the set/reset latches 92, 94 are input to respective output latches 96, 98 which in turn are clocked by the late clock. The outputs from the output latches 96, 98 are input to an AND gate 100. At the early time both set/reset latches are reset to a low value. If the signal is high at the early time, the low latch 92 is immediately set high while the high latch 94 stays low. If the signal transitions below the high threshold before the late clock, then the high latch 94 also is set indicating that sometime during the interval between the early and late clocks there was a negative crossing. Likewise if the signal is low at the early clock time, then the high latch 94 is set while the low latch 92 remains reset. If the signal transitions above the low threshold before the late clock, then the low latch also is set indicating that sometime during the interval between the early and late clocks there was a positive crossing. The outputs from the high and low latches 92, 94 are captured in the output latches 96, 98 by the late clock and then applied to the AND gate 100. If there are no glitches or runts or other eye violations in the interval between the early and late clocks, then only one of the output latches 96, 98 has a logic "true" output and there is no eye violation indicated at the output of the AND gate 100. However if there is an eye violation including a glitch or runt between the early and late clocks, both output latches 96, 98 provide a logic "true" as outputs and the output from the AND gate 100 indicates the eye violation, i.e., both of the output latches have the same set state when the late clock time occurs.

An alternative embodiment to that shown in FIG. 7 has the AND gate 100 immediately after the set/reset latches 92, 94, with the output from the AND gate being captured by a single output latch that is clocked by the late clock. This configuration may be used if the transition time through the AND gate 100 is fast enough.

Additional comparators to those shown in FIG. 3 with thresholds above the expected logic-high and below the expected logic-low respectively may be used to provide additional mask areas above and below the data eye region. Also an arbitrary mask other than a rectangular mask may be generated using multiple comparators and threshold levels as well as additional early and late clocks to generate a plurality of rectangular shapes having different heights and widths, which shapes are superimposed by corresponding latches to approximate any polygonally shaped mask. In this way a mask that more closely conforms to the idealized eye pattern 10 within specified tolerances or to any other desired arbitrary pattern may be generated.

Figure 8:
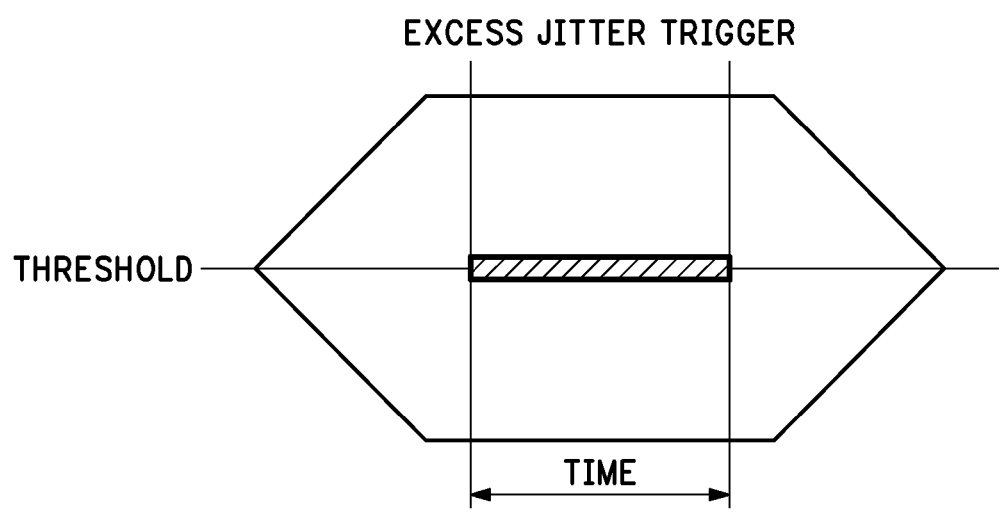
FIG. 8 is a graphic view of a mask for an excess jitter trigger according to an embodiment of the present invention.

An excess jitter trigger is a subset of the eye violation trigger that uses essentially a single comparison threshold but still samples the data at two different points in time, as shown in FIG. 8, i.e., a mask 12 of zero height so that it detects misplaced edges (excessive jitter) but not vertical (voltage margin) errors. In an oscilloscope, the eye diagrams and waveforms of FIGS. 5 and 6 are normally displayed on a display screen for observation by a user. One skilled in the art will also recognize that the eye diagram data and violation data could be stored in a memory, or transferred to an external PC, for later analysis.

The eye violation or excess jitter trigger may be used for purposes other than to trigger data acquisition by an oscilloscope. The trigger output may also be sent to a counter to keep track of how many violations occur over a given time span to inform a user of a total violation count and/or violation rate (violations per second). Also a timer may be used together with the counter to determine how much time occurs before a given number of violations occur. In this way parameters related to the eye pattern violations may be determined, such as bit error rate to name one.

Thus, the subject invention provides an eye violation and excess jitter trigger circuit by defining a mask within an eye or unit interval of a high speed serial digital signal so that any transitions of the signal that occur across the mask during the unit interval generate the desired trigger output.

In a further embodiment of the subject invention, an enhanced Bit Error Rate Tester (BERT) detects and counts mask violations rather than, or in addition to, bit error rates. Such an enhanced BERT would have a display for displaying a count of occurrences of the mask violations, or alternatively, would provide the count to a user by way of an output data communications port.

In yet another embodiment of the invention, a serial data decoding unit, such as a BERTScope CR 12500 Clock Recovery Instrument, manufactured by Synthesis Research, Inc., Menlo Park, Calif., can be enhanced to employ the subject invention to produce a mask violation indicative signal along with, or in place of, the decoded serial data stream.

What is claimed is:

1. A digital oscilloscope capturing for display a portion of a digital signal containing an eye violation, comprising:
an acquisition circuit for acquiring samples of a digital signal under test;
mask defining circuitry for defining a mask area within a unit interval of said signal under test;
a violation detector circuit detecting said eye violation in said portion of said digital signal within said unit interval as said digital signal is being acquired;
said detector generating a violation signal when said digital signal crosses into said mask area during said unit interval; and
a display unit for displaying said digital signal; wherein
said mask defining circuitry includes a threshold comparator circuit, said threshold comparator circuit receiving said digital signal, a high threshold level signal and a low threshold level signal and providing as outputs high data and low data; and
clock deriving circuitry deriving an early clock and a late clock from a reference clock;
said high and low thresholds levels and said early and late clocks defining said mask as a rectangle within said unit interval; and wherein
said violation detection receiving as inputs said high data, said low data, said early clock and said late clock and providing as an output said violation signal, said violation signal being a trigger signal, said trigger signal causing said digital oscilloscope to capture said data from said digital signal that is related to said violation, for processing and display on said display unit.

2. The digital oscilloscope as recited in claim 1 further comprising a data/clock recovery circuit receiving as an input a data signal derived from said digital signal and providing as an output a recovered clock as said reference clock.

3. The digital oscilloscope as recited in claim 1 further comprising:
circuitry recovering said reference clock from said high and low data.

4. The digital oscilloscope as recited in claim 1 wherein the threshold comparator circuit comprises:
a low comparator having the digital signal and the low threshold as inputs to produce the low data as an output; and
a high comparator having the digital signal and the high threshold as inputs to produce the high data as an output.

5. The digital oscilloscope as recited in claim 1 said violation detector circuitry comprises:
a high latch having inverted high data as a set input and the early clock as a reset input, the high latch being set when the digital signal transitions from above to below the high threshold or when the digital signal is below the high threshold;
a low latch having the low data as a set input and the early clock as a reset input, the low latch being set when the digital signal transitions from below to above the low threshold or when the digital signal is above the low threshold; and
circuitry providing said violation signal when both of the low and high latches are set when the late clock occurs.

6. The digital oscilloscope as recited in claim 5 wherein the providing circuitry comprises:
a high output latch having the output from the high latch as an input and the late clock as a clock input to capture a status of the high latch when the late clock occurs;
a low output latch having the output from the low latch as an input and the late clock as a clock input to capture a status of the low latch when the late clock occurs; and
logic combining the status of the high and low output latches when the late clock occurs to produce the violation signal if the status for both output latches is high.

7. The digital oscilloscope as recited in claim 5 wherein the providing circuitry comprises:
    logic combining outputs from the high and low latches to produce a violation indicator; and
    an output latch clocked by the late clock and having as an input the violation indicator to provide as an output the violation signal.

8. The digital oscilloscope as recited in claim 1 further comprising a counter, said counter counting a number of violations indicated by the violation signal.

9. The digital oscilloscope as recited in claim 8, further comprising time measuring circuitry, said time measuring circuitry measuring time with respect to the number of violations to determine a parameter relating to the number of violations occurring within a specified time period.

10. The digital oscilloscope as recited in claim 9, wherein said time measuring circuitry measures time with respect to the number of violations to determine a parameter relating to the time period within which a specified number of violations occur.

11. The digital oscilloscope as recited in claim 1 wherein said mask defining circuitry comprises:
    a plurality of comparators in high/low pairs, each pair having a respective high threshold and low threshold to produce respective high and low data;
    a plurality of early and late clocks derived from a reference clock, the high and low data being combined with respective early and late clock pairs to produce a plurality of rectangles of differing dimensions; and
    mask combining circuitry combining the rectangles to produce a mask approximating an arbitrary polygonal shape defined by the thresholds and clocks.

12. A digital oscilloscope capturing for display a portion of a digital signal containing an eye violation, comprising:
    an acquisition circuit for acquiring samples of a digital signal under test;
    mask defining circuitry for defining a mask area within a unit interval of said signal under test;
    a violation detector circuit detecting said eye violation in said portion of said digital signal within said unit interval as said digital signal is being acquired;
    said detector generating a violation signal when said digital signal crosses into said mask area during said unit interval; and
    a display unit for displaying said digital signal; wherein
    said mask defining circuitry includes a threshold comparator circuit, said threshold comparator circuit receiving said digital signal, a high threshold level signal and a low threshold level signal and providing as outputs high data and low data; and
    clock deriving circuitry deriving an early clock and a late clock from a reference clock;
    said high and low thresholds levels and said early and late clocks defining said mask as a rectangle within said unit interval; and wherein
    said violation detection receiving as inputs said high data, said low data, said early clock and said late clock and providing as an output said violation signal, said violation signal being a trigger signal, said trigger signal causing said digital oscilloscope to capture said data from said digital signal that is related to said violation, for processing and display on said display unit; and
    further comprising a data/clock recovery circuit receiving as an input a data signal derived from said digital signal and providing as an output a recovered clock as said reference clock; and
    wherein the data/clock recovery circuit further comprises a recovered data output coupled to a further input of said violation detection circuit for providing said violation signal.

13. A digital oscilloscope capturing for display a portion of a digital signal containing an eye violation, comprising:
    an acquisition circuit for acquiring samples of a digital signal under test;
    mask defining circuitry for defining a mask area within a unit interval of said signal under test;
    a violation detector circuit detecting said eye violation in said portion of said digital signal within said unit interval as said digital signal is being acquired;
    said detector generating a violation signal when said digital signal crosses into said mask area during said unit interval; and
    a display unit for displaying said digital signal; wherein
    said mask defining circuitry includes a threshold comparator circuit, said threshold comparator circuit receiving said digital signal, a high threshold level signal and a low threshold level signal and providing as outputs high data and low data; and
    clock deriving circuitry deriving an early clock and a late clock from a reference clock;
    said high and low thresholds levels and said early and late clocks defining said mask as a rectangle within said unit interval; and wherein
    said violation detection receiving as inputs said high data, said low data, said early clock and said late clock and providing as an output said violation signal, said violation signal being a trigger signal, said trigger signal causing said digital oscilloscope to capture said data from said digital signal that is related to said violation, for processing and display on said display unit;
    wherein the threshold comparator circuit comprises:
        a low comparator having the digital signal and the low threshold as inputs to produce the low data as an output; and
        a high comparator having the digital signal and the high threshold as inputs to produce the high data as an output; and
    wherein the status determining circuitry comprises:
        a pair of latches having the low data as an input, one latch being clocked by the early clock and the other latch being clocked by the late clock to capture a status of the low data at two corners of the mask; and
        a pair of latches having the high data as an input, one latch being clocked by the early clock and the other latch being clocked by the late clock to capture a status of the high data at the opposing two corners of the mask, the status of the latches at the corners defining a status of the digital signal with respect to the mask.

14. The digital oscilloscope as recited in claim 13 wherein said violation detector circuitry comprises a logic circuit having said outputs of said latches as inputs and providing said violation signal as an output when said latch outputs are not equal to each other.

15. The digital oscilloscope as recited in claim 4 wherein the threshold comparator circuit further comprises a nominal comparator having the digital signal and a mid-level threshold as inputs to produce a data signal as an output.

16. The digital oscilloscope as recited in claim 15 wherein the status determining circuitry further comprises an input latch having recovered data derived from the data signal as an input and being clocked by the reference clock to capture a status of the digital signal at a center of the mask so that the status of the digital signal at the corners and center of the mask define the status of the digital signal with respect to the mask.

17. The digital oscilloscope as recited in claim 16 wherein said violation detector circuitry comprises:
   a plurality of XOR gates, each having as a first input the output from a respective one of the latches, having the recovered data from the input latch as a second input and having an output; and
   an OR gate having inputs coupled to the outputs of the XOR gates so that, when at least one of the outputs from the XOR gates indicates inequality at the inputs of the at least one of the XOR gates, said violation signal is produced at an output.

* * * * *